(12) United States Patent
Pillow et al.

(10) Patent No.: US 9,761,820 B2
(45) Date of Patent: Sep. 12, 2017

(54) POLYMER

(71) Applicants: Cambridge Display Technology Limited, Godmanchester (GB); Sumitomo Chemical Company Limited, Tokyo (JP)

(72) Inventors: Jonathan Pillow, Godmanchester (GB); Natasha M. J. Conway, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 630 days.

(21) Appl. No.: 14/375,897

(22) PCT Filed: Jan. 31, 2013

(86) PCT No.: PCT/GB2013/050220
§ 371 (c)(1),
(2) Date: Jul. 31, 2014

(87) PCT Pub. No.: WO2013/114118
PCT Pub. Date: Aug. 8, 2013

(65) Prior Publication Data
US 2015/0028313 A1    Jan. 29, 2015

(30) Foreign Application Priority Data

Jan. 31, 2012 (GB) .................................. 1201660.6
Nov. 30, 2012 (GB) .................................. 1221623.0
Dec. 24, 2012 (GB) .................................. 1223369.8

(51) Int. Cl.
*H01L 51/54* (2006.01)
*C09K 11/06* (2006.01)
(Continued)

(52) U.S. Cl.
CPC .......... *H01L 51/5016* (2013.01); *C08G 61/02* (2013.01); *C08G 61/12* (2013.01); *C08G 61/123* (2013.01); *H01L 51/0003* (2013.01); *H01L 51/0039* (2013.01); *H01L 51/0043* (2013.01); *H01L 51/5056* (2013.01); *C08G 2261/12* (2013.01); *C08G 2261/135* (2013.01); *C08G 2261/148* (2013.01);
(Continued)

(58) Field of Classification Search
CPC ........ C08G 61/00; C08G 61/02; C08G 61/12; C08G 61/123; C08G 2261/00; C08G 2261/10; C08G 2261/12; C08G 2261/13; C08G 2261/135; C08G 2261/14; C08G 2261/141; C08G 2261/1412; C08G 2261/148; C08G 2261/30; C08G 2261/31; C08G 2261/314; C08G 2261/3142; C08G 2261/316; C08G 2261/3162; C08G 2261/32; C08G 2261/324; C08G 2261/3245; C08G 2261/41; C08G 2261/411; C08G 2261/412; C08G 2261/52; C08G 2261/522; C08G 2261/5222; C08G 2261/76; C08G 2261/95; H01L 51/0003; H01L 51/0032; H01L 51/0039; H01L 51/0043; H01L 51/50; H01L 51/5012; H01L 51/5016; H01L 51/5056
USPC ....... 428/690, 691, 917, 411.4, 336; 427/58, 427/66; 313/500–512; 257/40, 88–104, 257/E51.001–E51.052; 252/301.16–301.35; 438/46; 528/8; 570/183
See application file for complete search history.

(56) References Cited

U.S. PATENT DOCUMENTS 5,777,070 A    7/1998  Inbasekaran et al.
6,309,763 B1 *  10/2001  Woo ........................ C07C 25/22
                                                    313/504
(Continued)

FOREIGN PATENT DOCUMENTS

CN    1 042 535 A    5/1990
CN    1 865 227 A    11/2006
(Continued)

OTHER PUBLICATIONS

International Search Report and Written Opinion for International Application No. PCT/GB2013/050220 mailed Aug. 5, 2013.
International Preliminary Report on Patentability for International Application No. PCT/GB2013/050220 mailed Aug. 14, 2014.
Office Communication dated May 17, 2012 for Great Britain Application No. GB1201660.6.
Office Communication dated Mar. 27, 2013 for Great Britain Application No. GB1221623.0.
(Continued)

*Primary Examiner* — Andrew K Bohaty
(74) *Attorney, Agent, or Firm* — Wolf, Greenfield & Sacks, P.C.

(57) ABSTRACT

A polymer comprising an optionally substituted repeat unit of formula (I): wherein $R^1$ and $R^2$ in each occurrence are independently selected from H or a substituent; $R^1$ and $R^2$ may be linked to form a ring; and A is an optionally substituted linear, branched or cyclic alkyl group.

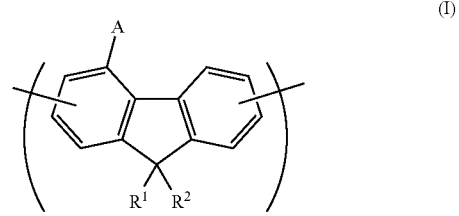

(I)

20 Claims, 3 Drawing Sheets

(51) Int. Cl.
    *H01L 51/50*    (2006.01)
    *C08G 61/12*    (2006.01)
    *C08G 61/02*    (2006.01)
    *H01L 51/00*    (2006.01)

(52) U.S. Cl.
    CPC .............. *C08G 2261/1412* (2013.01); *C08G 2261/3142* (2013.01); *C08G 2261/3162* (2013.01); *C08G 2261/3245* (2013.01); *C08G 2261/411* (2013.01); *C08G 2261/5222* (2013.01); *C08G 2261/76* (2013.01); *C08G 2261/95* (2013.01); *H01L 51/5012* (2013.01)

(56) References Cited

U.S. PATENT DOCUMENTS

| | | |
|---|---|---|
| 2007/0029927 A1 | 2/2007 | Kawamura et al. |
| 2007/0205714 A1 | 9/2007 | Busing et al. |
| 2007/0265473 A1 | 11/2007 | Becker et al. |
| 2008/0102312 A1 | 5/2008 | Parham et al. |
| 2008/0309229 A1 | 12/2008 | Steudel et al. |
| 2009/0036622 A1* | 2/2009 | Marrocco .............. C08G 61/02 526/241 |

FOREIGN PATENT DOCUMENTS

| | | |
|---|---|---|
| CN | 101 012 209 A | 8/2007 |
| CN | 101 747 210 A | 6/2010 |
| CN | 1852934 B | 12/2011 |
| EP | 0 615 165 A2 | 9/1994 |
| EP | 0 707 020 A2 | 4/1996 |
| EP | 2 112 184 A1 | 10/2009 |
| EP | 2 112 185 A1 | 10/2009 |
| GB | 2 395 198 A | 5/2004 |
| JP | 07181708 A | 7/1995 |
| JP | 11-184119 | 7/1999 |
| JP | 2005-120030 A | 5/2005 |
| WO | WO 99/67197 A1 | 12/1999 |
| WO | WO 00/46321 A1 | 8/2000 |
| WO | WO 02/26856 A1 | 4/2002 |
| WO | WO 2006/064194 A1 | 6/2006 |
| WO | WO 2006/091799 A1 | 8/2006 |
| WO | WO 2006/123061 A2 | 11/2006 |
| WO | WO 2009/008351 A1 | 1/2009 |

OTHER PUBLICATIONS

Office Communication dated Apr. 26, 2013 for Great Britain Application No. GB1223369.8.

Jang et al., Synthesis and Characterization of Highly Conjugated Cyclopenta[def]phenanthrene-Based Polymers. Macromol Res. 2010;18(2):185-91.

Lei et al., Fluorene-based conjugated polymer with tethered thymines: click postpolymerization synthesis and optical response to mercury(II). J App Poly Sci. 2013;129(4):1763-72.

Lim et al., Suppression of green emission in a new class of blue-emitting polyfluorene copolymers with twisted biphenyl moieties. Adv Funct Mater. 2005;15(6):981-8.

Oldridge et al., Synthesis of a soluble poly(fluorenone). Chem Commun (Camb). Feb. 28, 2006;(8):885-7. Epub Jan. 19, 2006.

Price et al., Biphenyl- and fluorenyl-based potential molecular electronic devices. Tetrahedron. 2003;59(17):3131-56.

Wang et al., Theoretical Studies of the Absorption and Emission Properties of the Fluorene-Based Conjugated Polymers. Macromol. 2004;37:3451-8.

\* cited by examiner

POLYMER

RELATED APPLICATIONS

The present application is a national stage filing under 35 U.S.C. §371 of international PCT application, PCT/GB2013/050220, filed Jan. 31, 2013, which claims priority to United Kingdom patent application, GB 1201660.6, filed Jan. 31, 2012, United Kingdom patent application, GB 1221623.0, filed Nov. 30, 2012, and United Kingdom patent application, GB 1223369.8, filed Dec. 24, 2012, each of which is incorporated herein by reference.

BACKGROUND OF THE INVENTION

Electronic devices comprising organic semiconductors are attracting increasing attention for use in devices such as organic light emitting diodes, organic photoresponsive devices (in particular organic photovoltaic devices and organic photosensors), organic transistors and memory array devices. Devices comprising organic materials offer benefits such as low weight, low power consumption and flexibility. Moreover, use of soluble organic materials allows use of solution processing in device manufacture, for example inkjet printing or spin-coating.

An organic optoelectronic device may comprise a substrate carrying an anode, a cathode and an organic semiconducting layer between the anode and cathode.

The organic semiconducting layer is an organic light-emitting layer in the case where the device is an organic light-emitting device (OLED). Holes are injected into the device through the anode (for example indium tin oxide, or ITO) and electrons are injected through the cathode during operation of the device. Holes in the highest occupied molecular orbital (HOMO) and electrons in the lowest unoccupied molecular orbital (LUMO) of the light combine to form an exciton that releases its energy as light. Suitable light-emitting materials include small molecule, polymeric and dendrimeric materials. Suitable light-emitting polymers for use in layer include poly(arylene vinylenes) such as poly(p-phenylene vinylenes) and polyarylenes such as polyfluorenes. Alternatively or additionally, the light-emitting layer may comprise a host material and a light-emitting dopant, for example a fluorescent or phosphorescent dopant.

The operation of an organic photovoltaic device or photosensor entails the reverse of the above-described process in that photons incident on the organic semiconducting layer generate excitons that are separated into holes and electrons.

In order to facilitate the transfer of holes and electrons into the light-emitting layer of an OLED (or transfer of separated charges towards the electrodes in the case of a photovoltaic or photosensor device) additional layers may be provided between the anode and the cathode.

WO 00/46321 discloses polymers comprising fluorene repeat units.

EP 0707020 discloses polymers comprising spirobifluorene repeat units.

SUMMARY OF THE INVENTION

In a first aspect, the invention provides a polymer comprising an optionally substituted repeat unit of formula (I):

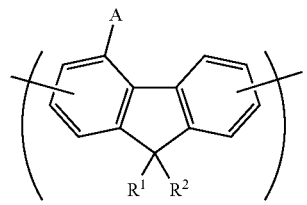

Wherein $R^1$ and $R^2$ in each occurrence are independently selected from H or a substituent; $R^1$ and $R^2$ may be linked to form a ring; and A is optionally substituted linear, branched or cyclic alkyl group.

Optionally, $R^1$ and $R^2$ are independently selected from the group consisting of hydrogen; optionally substituted aryl or heteroaryl groups, a linear or branched chain of optionally substituted aryl or heteroaryl groups; and optionally substituted alkyl wherein one or more non-adjacent C atoms of the alkyl group may be replaced with O, S, substituted N, C=O and —COO—.

Optionally, the repeat unit of formula (I) is linked to adjacent units through its 2- and 7-positions.

Optionally, $R^1$ and $R^2$ are not linked.

Optionally, $R^1$ and $R^2$ are linked.

Optionally, $R^1$ and $R^2$ are linked to form a repeat unit of formula (II):

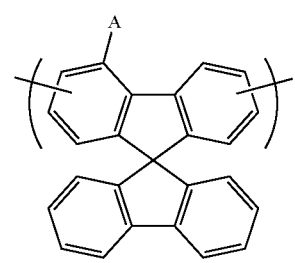

Optionally, the repeat unit of formula (I) has formula (III):

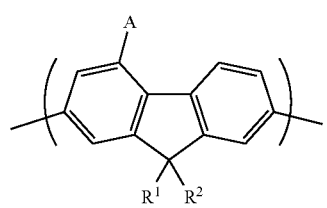

Optionally, the polymer comprises repeat units of formula (I) and one or more further repeat units.

Optionally, the polymer comprises optionally substituted fluorene repeat units other than repeat units of formula (I).

Optionally, the polymer comprises optionally substituted repeat units of formula (IV):

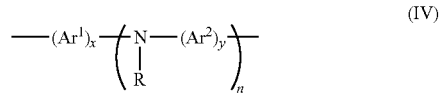

wherein $Ar^1$ and $Ar^2$ in each occurrence are independently selected from optionally substituted aryl or heteroaryl groups, n is greater than or equal to 1, R is H or a substituent, x and y are each independently 1, 2 or 3, and any of $Ar^1$, $Ar^2$ and R may be linked by a direct bond or a divalent linking group.

Optionally, A is $C_{1-30}$ alkyl, optionally $C_{5-25}$ alkyl.

Optionally, A is a branched alkyl.

In a second aspect, the invention provides an optionally substituted monomer of formula (V):

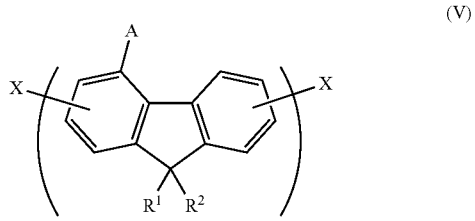

(V)

wherein X is a polymerisable group, and $R^1$, $R^2$ and X are as described in the first aspect.

Optionally according to the second aspect, X is a leaving group capable of participating in a metal-mediated cross-coupling reaction Optionally according to the second aspect, X is selected from the group consisting of chlorine, bromine, iodine, sulfonic acid or ester, and boronic acid or ester.

In a third aspect, the invention provides a method of forming a polymer according to the first aspect comprising the step of polymerizing the monomer according to the second aspect.

Optionally according to the third aspect, the polymerization is performed in the presence of a nickel catalyst Optionally according to the third aspect, the polymerization is performed in the presence of a palladium catalyst and a base.

In a fourth aspect the invention provides an organic electronic device comprising at least one layer comprising a polymer according to the first aspect.

Optionally according to the fourth aspect, the device is an organic light-emitting device comprising an anode, a cathode and a light-emitting layer between the anode and the cathode.

Optionally according to the fourth aspect, the at least one layer comprising a polymer according to the first aspect is the light-emitting layer.

Optionally according to the fourth aspect, the at least one layer comprising a polymer according to the first aspect is a hole transporting layer between the anode and the light-emitting layer.

In a fifth aspect the invention provides a method of forming an organic electronic device according to the fourth aspect, the method comprising the step of depositing the at least one layer comprising a polymer according to the first aspect.

Optionally according to the fifth aspect, the at least one layer is formed by depositing a solution comprising the polymer and at least one solvent, and evaporating the solvent.

DESCRIPTION OF THE DRAWINGS

The invention will now be described in more detail with reference to the Figures, wherein.

DETAILED DESCRIPTION OF THE INVENTION

Figure 1:
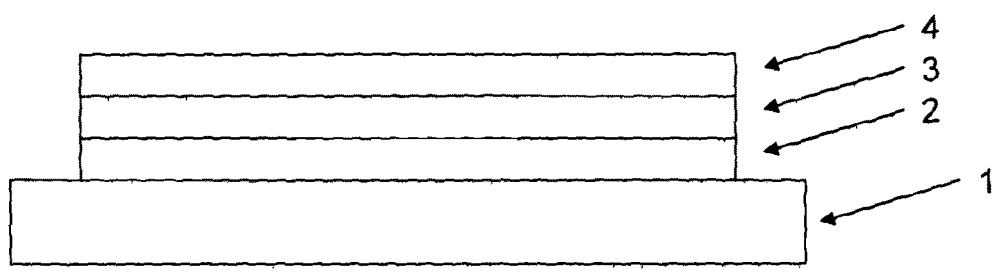
FIG. 1 is a schematic illustration of an organic light-emitting diode according to an embodiment of the invention.

The polymer may be a homopolymer or copolymer in which the only repeat units are repeat units of formula (I), or a copolymer comprising repeat units of formula (I) and one or more further repeat units. The polymer is preferably at least partially conjugated along its backbone. The repeat unit of formula (I) may form a conjugating path between repeat units on either side of the repeat unit of formula (I).

Substituent A of the repeat unit of formula (I) may serve to solubilise polymers comprising this repeat unit in common organic solvents, such as mono- or poly-alkylated benzenes. This may be particularly advantageous in the case where one or both of the substituents in the 9-position of this unit is a non-solubilising or weakly solubilising substituent such as phenyl or methyl. In this way, substituent A may afford solubility while at the same time substituents in the 9-position may be selected to tune other properties of the polymer. Substituent A may also be used to tune the morphology of polymer films formed from polymers comprising repeat units of Formula (I).

Moreover, the present inventors have found that alkyl substituents A have the effect of shifting emission of a polymer to shorter wavelengths (blue shift). Without wishing to be bound by any theory, this blue shift may be a result of electron donation by substituent A, causing the LUMO level of the repeat unit of formula (I) to be closer to vacuum and providing a larger HOMO-LUMO bandgap than a repeat unit in which substituent A is absent.

Substitutents $R^1$ and $R^2$ may be selected to tune the physical and/or electronic properties of the polymer, for example its solubility, glass transition temperature or LUMO level.

In the case where $R^1$ or $R^2$ comprises alkyl, optional substituents of the alkyl group include F, CN, nitro, and aryl or heteroaryl optionally substituted with one or more groups $R^4$ wherein each $R^4$ is independently alkyl, for example $C_{1-20}$ alkyl, in which one or more non-adjacent C atoms may be replaced with O, S, substituted N, C=O and —COO— and one or more H atoms of the alkyl group may be replaced with F.

In the case where $R^1$ and/or $R^2$ comprises aryl or heteroaryl, each aryl or heteroaryl group may independently be substituted. Preferred optional substituents for the aryl or heteroaryl groups include one or more substituents $R^3$, wherein each $R^3$ is independently selected from the group consisting of:

alkyl, for example C$_{1-20}$ alkyl, wherein one or more non-adjacent C atoms may be replaced with O, S, substituted N, C=O and —COO— and one or more H atoms of the alkyl group may be replaced with F or aryl or heteroaryl optionally substituted with one or more groups R$^4$, aryl or heteroaryl optionally substituted with one or more groups R$^4$,

NR$^5{}_2$, OR$^5$, SR$^5$, fluorine, nitro and cyano, and crosslinkable groups;

wherein R$^4$ is as described above, and each R$^5$ is independently selected from the group consisting of alkyl and aryl or heteroaryl optionally substituted with one or more alkyl groups. A preferred aryl group is phenyl.

Where present, substituted N in repeat units of formula (IV) may independently in each occurrence be NR$^5$ or NR$^6$, wherein R$^5$ is as described above and R$^6$ in each occurrence is wherein R$^6$ is alkyl or optionally substituted aryl or heteroaryl. Optional substituents for aryl or heteroaryl groups R$^6$ may be selected from R$^4$ or R$^5$.

One or both of R$^1$ and R$^2$ may be a linear or branched chain of optionally substituted aryl or heteroaryl groups as described above. The chain may contain two, three or more aryl or heteroaryl groups, and the chain may the chain may be made up of the same aryl or heteroaryl groups or of two or more different aryl or heteroaryl groups.

In one preferred arrangement, at least one of R$^1$ and R$^2$ comprises an optionally substituted C$_1$-C$_{20}$ alkyl or an optionally substituted aryl group, in particular phenyl that may be unsubstituted or substituted. Preferred substituents for substituted phenyls R$^1$ and/or R$^2$ are one or more C$_{1-20}$ alkyl groups.

In the case where R$^1$ and R$^2$ are both phenyl and are linked, they may form a fluorene ring. The fluorene ring formed by linkage of R$^1$ and R$^2$ may be substituted with one or more substituents.

R$^1$ and/or R$^2$ may be crosslinkable. For example, R$^1$ and/or R$^2$ may comprise a polymerisable double bond such and a vinyl or acrylate group, or a benzocyclobutane group.

The 4-position of the repeat unit of formula (I) is substituted with substituent A, as described above. Substituent A is preferably an unsaturated group, for example a linear, branched or cyclic alkyl group such as a C$_{1-20}$ alkyl group.

The sp$^2$ carbon atoms of the fluorene ring system, other than the 4-position substituted with substituent A, may be substituted or unsubstituted. Where present, substituents for these other sp$^2$ carbon atoms are preferably selected from the group consisting of C$_{1-20}$ alkyl wherein one or more non-adjacent C atoms may be replaced with O, S, substituted N, C=O and —COO—, optionally substituted aryl, optionally substituted heteroaryl, fluorine, cyano and nitro.

Exemplary repeat units of formula (I) in which R$^1$ and R$^2$ are linked include the following:

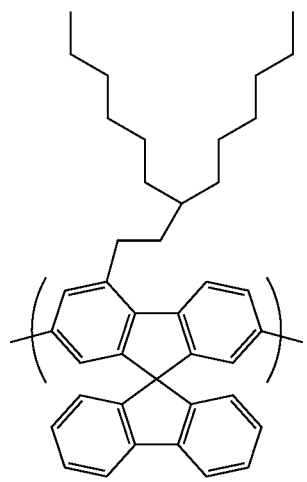

Exemplary repeat units of formula (I) in which R$^1$ and R$^2$ are not linked include the following:

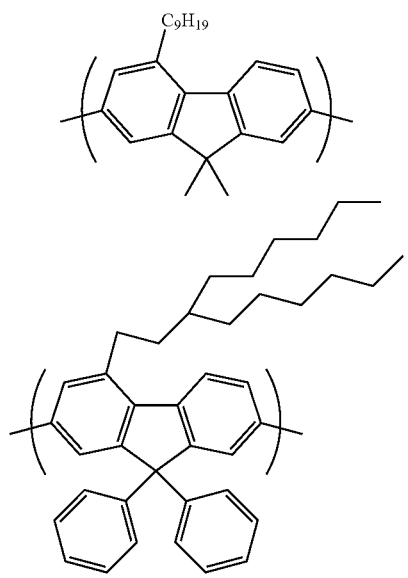

Co-Repeat Units

Exemplary co-repeat units of the polymer may include one or more of the following:

aryl or heteroaryl repeat units, for example fluorene repeat units other than repeat units of formula (I), phenylene repeat units and/or triazine repeat units; and arylamine repeat units Arylamine repeat units may have formula (V):

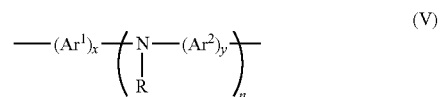

wherein Ar$^1$ and Ar$^2$ in each occurrence are independently selected from optionally substituted aryl or heteroaryl groups, n is greater than or equal to 1, preferably 1 or 2, R is H or a substituent, preferably a substituent, and x and y are each independently 1, 2 or 3.

R is preferably alkyl, for example $C_{1-20}$ alkyl, $Ar^3$, or a branched or linear chain of $Ar^3$ groups, for example —$(Ar^3)_r$, wherein $Ar^3$ in each occurrence is independently selected from aryl or heteroaryl and r is at least 1, optionally 1, 2 or 3.

Any of $Ar^1$, $Ar^2$ and $Ar^3$ may independently be substituted with one or more substituents.

Preferred substituents are selected from the group $R^3$ consisting of:
- alkyl, for example $C_{1-20}$ alkyl, wherein one or more non-adjacent C atoms may be replaced with O, S, substituted N, C=O and —COO— and one or more H atoms of the alkyl group may be replaced with F or aryl or heteroaryl optionally substituted with one or more groups $R^4$,
- aryl or heteroaryl optionally substituted with one or more groups $R^4$,
- $NR^5_2$, $OR^5$, $SR^5$,
- fluorine, nitro and cyano, and
- crosslinkable groups;

wherein each $R^4$ is independently alkyl, for example $C_{1-20}$ alkyl, in which one or more non-adjacent C atoms may be replaced with O, S, substituted N, C=O and —COO— and one or more H atoms of the alkyl group may be replaced with F, and each $R^5$ is independently selected from the group consisting of alkyl and aryl or heteroaryl optionally substituted with one or more alkyl groups.

Any of the aryl or heteroaryl groups in the repeat unit of Formula (V) may be linked by a direct bond or a divalent linking atom or group. Preferred divalent linking atoms and groups include O, S; substituted N; and substituted C.

Where present, substituted N or substituted C of $R^3$, $R^4$ or of the divalent linking group may independently in each occurrence be $NR^6$ or $CR^6_2$ respectively wherein $R^6$ is alkyl or optionally substituted aryl or heteroaryl. Optional substituents for aryl or heteroaryl groups $R^6$ may be selected from $R^4$ or $R^5$.

In one preferred arrangement, R is $Ar^3$ and each of $Ar^1$, $Ar^2$ and $Ar^3$ are independently and optionally substituted with one or more $C_{1-20}$ alkyl groups.

Particularly preferred units satisfying Formula (V) include units of Formulae 1-3:

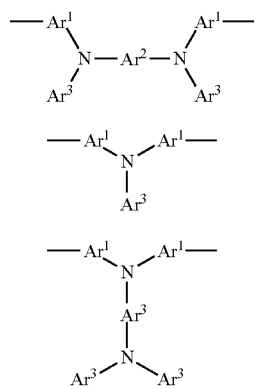

wherein $Ar^1$ and $Ar^2$ are as defined above; and $Ar^3$ is optionally substituted aryl or heteroaryl. Where present, preferred substituents for $Ar^3$ include substituents as described for $Ar^1$ and $Ar^2$, in particular alkyl and alkoxy groups.

$Ar^1$, $Ar^2$ and $Ar^3$ are preferably phenyl, each of which may independently be substituted with one or more substituents as described above.

In another preferred arrangement, aryl or heteroaryl groups of formula (V) are phenyl, each phenyl group being optionally substituted with one or more alkyl groups.

In another preferred arrangement, $Ar^1$, $Ar^2$ and $Ar^3$ are phenyl, each of which may be substituted with one or more $C_{1-20}$ alkyl groups, and r=1.

In another preferred arrangement, $Ar^1$ and $Ar^2$ are phenyl, each of which may be substituted with one or more $C_{1-20}$ alkyl groups, and R is 3,5-diphenylbenzene wherein each phenyl may be substituted with one or more alkyl groups.

Arylamine repeat units may provide hole-transporting and/or light-emitting properties, and a polymer comprising arylamine repeat units is preferably present in a hole transporting layer and/or a light-emitting layer of an OLED.

Arylamine repeat units may be present in an amount of up to 5 mol %, up to 10 mol %, up to 25 mol %, up to 50 mol % or up to 75 mol %. A polymer may contain one repeat unit of formula (V), or may contain two or more different repeat units of formula (V).

Exemplary fluorene repeat units of the polymer other than the repeat units of formula (I) include optionally substituted repeat units of formula (VI):

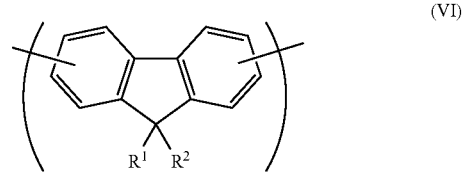

wherein $R^1$ and $R^2$ are as described above with reference to Formula (I), and the 4-position of the repeat unit is not substituted with a substituent A. Preferably, the repeat unit of formula (VI) is unsubstituted in its 4-position.

The repeat units of formula (VI) may be 2,7-linked.

A copolymer comprising repeat units of formula (I) may comprise 1-99 mol %, optionally 10-95 mol %, of repeat units of formula (I). The polymer may comprise less than 50 mol %, 50 mol % or more than 50 mol % of fluorene repeat units, including both repeat units of formula (I) and, if present, repeat units of formula (VI). The polymer may comprise chains of fluorene repeat units of formula (I) and, if present, formula (VI), in particular if the polymer comprises more than 50 mol % of fluorene repeat units. The chains of fluorene repeat units may be conjugated, particularly if the fluorene repeat units of formula (I) and (VI) are linked through their 2- and 7-positions.

Exemplary phenylene repeat units include repeat units of formula (VII):

wherein $R^1$ is a substituent described above with reference to formula (I) and p is 0, 1, 2, 3 or 4, optionally 1 or 2. In one arrangement, the repeat unit is a 1,4-phenylene repeat unit.

The repeat unit of formula (VII) may have formula (VIIa), wherein $R^1$ in each occurrence may be the same or different and is a substituent:

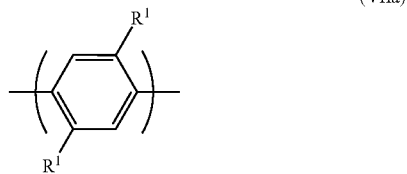

(VIIa)

The polymer may contain repeat units comprising triazine, for example a repeat unit of formula (VIII):

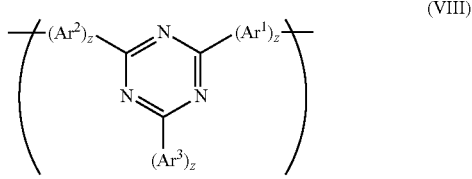

(VIII)

wherein $Ar^1$, $Ar^2$ and $Ar^3$ are as described with reference to repeat units of formula (V) and z independently in each occurrence is at least 1, optionally 1, 2 or 3. Each of $Ar^1$, $Ar^2$ and $Ar^3$ may independently be substituted with one or more substituents. In one arrangement, $Ar^1$, $Ar^2$ and $Ar^3$ are phenyl in each occurrence. Exemplary substituents include $R^3$ as described above with reference to repeat units of formula (V), for example $C_{1-20}$ alkyl or alkoxy. $Ar^1$, $Ar^2$ and $Ar^3$ are preferably phenyl.

Polymer Synthesis

Preferred methods for preparation of the polymers of the invention comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups may be used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end group or side group may be bound to the polymer by reaction of a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular copolymers may be prepared when both reactive groups of a first monomer are boron and both reactive groups of a second monomer are halogen.

As alternatives to halides, other leaving groups capable of participating in metal insertion include sulfonic acids and sulfonic acid esters such as tosylate, mesylate and triflate.

Devices

The polymer of the invention may be used as an active component in an organic electronic device, for example an organic light emitting diode, organic photoresponsive device (in particular organic photovoltaic device and organic photosensor) or an organic transistor.

FIG. 1 illustrates an organic light-emitting device comprising an anode 2 supported on a substrate 1, a cathode 4, and a light-emitting layer 3 between the anode and the cathode.

Further layers may be provided between the anode and the cathode, for example one or more layers selected from a hole-injecting layer, a hole-transporting layer, a hole-blocking layer, an electron-transporting layer, an electron-blocking layer, and one or more further light-emitting layers. In one preferred arrangement, a hole-transporting layer is provided between the anode and the light-emitting layer or layers. In another preferred arrangement, a hole-injection layer and a hole-transporting layer are provided between the anode and the light-emitting layer.

The polymer comprising a repeat unit of formula (I) may be provided in light-emitting layer 3 and/or in one or more of the further layers described above. In one preferred arrangement, the polymer is provided in a light-emitting layer. In another preferred arrangement, the OLED comprises a hole-transporting layer between the anode and the at least one light-emitting layer and the polymer comprising a repeat unit of formula (I) is provided in the hole-transporting layer.

Where present in a light-emitting layer, the polymer comprising repeat units of formula (I) may function as a light-emitting polymer. In a further arrangement, a light-emitting layer may comprise one or more light emitting materials and a non-emissive polymer comprising repeat units of formula (I), for example a host polymer comprising repeat units of formula (I) used with fluorescent or phosphorescent light-emitting materials, or a triplet-accepting polymer comprising repeat units of formula (I) used with a fluorescent light-emitting material.

If used as a host for a fluorescent or phosphorescent material, the lowest singlet or lowest triplet excited state, respectively, of the polymer comprising repeat units of formula (I) is preferably at least the same as or higher than that of the fluorescent or phosphorescent dopant it is used with. If used as a host then the polymer comprising repeat units of formula (I) preferably forms at least 50 mol % of components of the light-emitting layer.

If used as a triplet-accepting polymer, the lowest triplet excited stat of the polymer comprising repeat units of formula (I) is preferably at least the same as or lower than that of the fluorescent material it is used with such that triplet excitons may be transferred from the fluorescent light-emitting material to the triplet-accepting polymer. The triplet-accepting polymer may quench triplet excitons formed thereon, or may mediate triplet-triplet annihilation to produce delayed fluorescence. The light-emitting polymer:triplet accepting polymer ratio may be in the range of about 99:1-70:30 mol %, optionally about 99:5 to 80:20 mol %. Triplet-accepting polymers comprising repeat units of formula (I) are preferably copolymers. Exemplary co-repeat units include anthracene and pyrene repeat units, each of which may be unsubstituted or substituted with one or more substituents. Exemplary substituents include $C_{1-40}$ hydrocarbyl, for example $C_{1-20}$ alkyl.

Anode

Exemplary materials for the anode 2 include conductive organic compounds, conductive metal oxides, for example indium tin oxide, and metals. If light is emitted through the anode then the anode may be selected from the class of conductive transparent materials, for example indium tin oxide.

Cathode

The cathode 4 is selected from materials that have a workfunction allowing injection of electrons into the light-emitting layer or layers. Other factors influence the selection of the cathode such as the possibility of adverse interactions between the cathode and the materials of the light-emitting layer. The cathode may consist of a single material such as a layer of aluminium. Alternatively, it may comprise a plurality of metals, for example a bilayer of conductive materials, such as a bilayer of a low workfunction material and a high workfunction material such as calcium and aluminium as disclosed in WO 98/10621 or elemental barium as disclosed in WO 98/57381, Appl. Phys. Lett. 2002, 81(4), 634 and WO 02/84759. To assist electron injection, the cathode may comprise a thin layer of metal compound, in particular an oxide or fluoride of an alkali or alkali earth metal, capped with one or more layers of a conductive material, for example one or more layers of metal. Exemplary metal compounds include lithium fluoride, for example as disclosed in WO 00/48258; barium fluoride, for example as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprise a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

In one arrangement, the surface of the cathode contacts a surface of the light-emitting layer. In another arrangement, one or more layers may be provided between the cathode and the light-emitting layer. For example, an organic electron-transporting layer may be provided between the light-emitting layer and the cathode.

Hole Injection Layers

A conductive hole injection layer, which may be formed from a conductive organic or inorganic material, may be provided between the anode 2 and the light-emitting layer 3 to assist hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Light Emitting Layer

Suitable light-emitting materials for use in the light-emitting layer 3 include small molecule, polymeric and dendrimeric materials, and compositions thereof. Suitable light-emitting polymers include conjugated polymers, for example optionally substituted poly(arylene vinylenes) such as poly(p-phenylene vinylenes) and optionally substituted polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

A polymer comprising a repeat unit of formula (I) may be provided as a light-emitting polymer in the light-emitting layer.

The light-emitting layer may consist of a light-emitting material alone, or may comprise this material in combination with one or more further materials. In particular, the light-emitting material may be blended with hole and/or electron transporting materials or alternatively may be covalently bound to hole and/or electron transporting materials as disclosed in for example, WO 99/48160.

Light-emitting copolymers may comprise a light-emitting region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality—for example, an amine unit of formula (V) as described above may provide both hole transport and light-emission functionality. A light-emitting copolymer comprising light-emitting repeat units and one or both of a hole transporting repeat units and electron transporting repeat units may provide said units in a polymer main-chain, as per U.S. Pat. No. 6,353,083, or in polymer side-groups pendant from the polymer backbone.

Suitable light-emitting materials may emit in the UV, visible and/or infra-red region of the electromagnetic spectrum. The OLED may contain one or more of red, green and blue light-emitting materials.

A blue light-emitting material may have photoluminescent spectrum with a peak wavelength in the range of less than or equal to 480 nm, such as in the range of 400-480 nm A green light-emitting material may have photoluminescent spectrum with a peak wavelength in the range of above 480 nm-560 nm.

A red light-emitting material may have photoluminescent spectrum with a peak wavelength in the range of above 560 nm-630 nm.

More than one light-emitting material may be used. For example, red, green and blue light-emitting materials may be used to obtain white light emission. These different light-emitting materials may be in the same or in different light-emitting layers The light emitting layer may comprise a host material and at least one light-emitting dopant. The host material may be a material that would, in the absence of a dopant, emit light itself. When a host material and dopant are used in a device, the dopant alone may emit light. Alternatively, the host material and one or more dopants may emit light. White light may be generated by emission from multiple light sources, such as emission from both the host and one or more dopants or emission from multiple dopants.

In the case of a fluorescent light-emitting dopant the singlet excited state energy level ($S_1$) of the host material should be higher than that of the fluorescent light-emitting dopant in order that singlet excitons may be transferred from the host material to the fluorescent light-emitting dopant. Likewise, in the case of a phosphorescent light-emitting dopant the triplet excited state energy level ($T_1$) of the host material should be higher than that of the phosphorescent light-emitting dopant in order that triplet excitons may be transferred from the host material to the fluorescent light-emitting dopant. The host material may be a polymer according to the invention. Linkage of the fluorene rings of the repeat unit of formula (I) in positions other than the 2,7-positions may provide a polymer that is less conjugated, and consequently possessing a higher $S_1$ and/or $T_1$ level, than a corresponding polymer in which repeat units of formula (I) are linked through positions other than the 2,7-positions.

Exemplary phosphorescent light-emitting dopants include metal complexes comprising optionally substituted complexes of formula (IX):

(IX)

wherein M is a metal; each of $L^1$, $L^2$ and $L^3$ is a coordinating group; q is an integer; r and are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium are particularly preferred.

Exemplary ligands $L^1$, $L^2$ and $L^3$ include carbon or nitrogen donors such as porphyrin or bidentate ligands of formula (X):

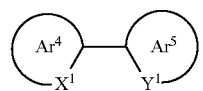

(X)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

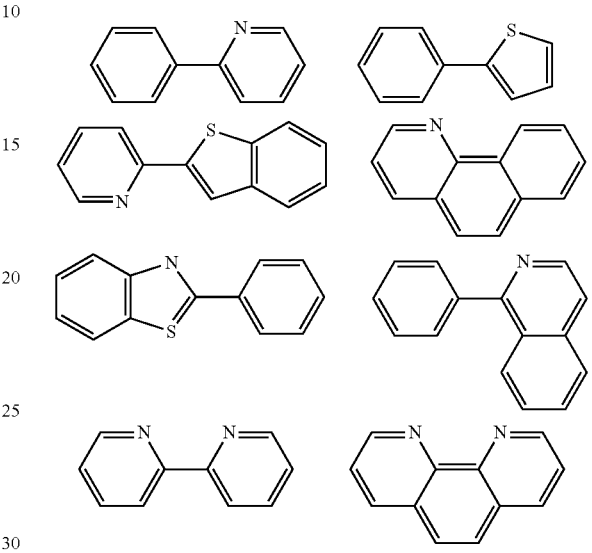

Each of $Ar^4$ and $Ar^5$ may carry one or more substituents. Two or more of these substituents may be linked to form a ring, for example an aromatic ring.

Other ligands suitable for use with d-block elements include diketonates, in particular acetylacetonate (acac); triarylphosphines and pyridine, each of which may be substituted.

Exemplary substituents include groups $R^3$ groups $R^3$ as described above with reference to Formula (V). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; bromine, chlorine or iodine which can serve to functionalise the ligand for attachment of further groups, for example as disclosed in WO 02/68435 and EP 1245659; and dendrons which may be used to obtain or enhance solution processability of the metal complex, for example as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI):

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

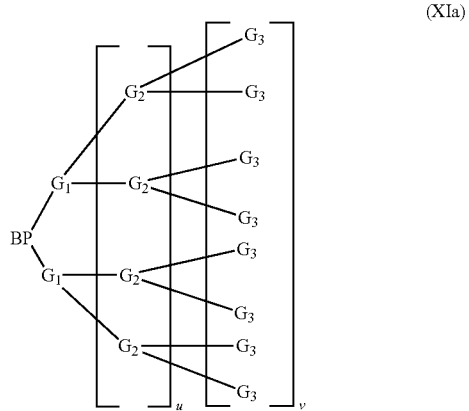

(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups.

BP and/or any group G may be substituted with one or more substituents, for example one or more $C_{1-20}$ alkyl or alkoxy groups.

Where used, a light-emitting dopant may be present in an amount of about 0.05 mol % up to about 20 mol %, optionally about 0.1-10 mol % relative to their host material.

The light-emitting dopant may be physically mixed with the host material or it may be chemically bound to the host material in the same manner described above with respect to binding of the light-emitting dopant to the charge transporting material.

A polymer comprising a repeat unit of formula (I) may be used as a host for an emissive dopant, for example a red or green phosphorescent dopant.

More than one light-emitting layer may be present.

The light-emitting layer(s) may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Charge Transporting Layers

A hole transporting layer may be provided between the anode and the light-emitting layer. Likewise, an electron transporting layer may be provided between the cathode and the light-emitting layer.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

If present, a hole transporting layer located between anode 2 and light-emitting layer 3 preferably has a HOMO level of less than or equal to 5.5 eV, more preferably around 4.8-5.5 eV. HOMO levels may be measured by cyclic voltammetry.

If present, an electron transporting layer located between light-emitting layer 3 and cathode 4 preferably has a LUMO level of around 3-3.5 eV as measured by cyclic voltammetry. For example, a layer of a silicon monoxide or silicon dioxide or other thin dielectric layer having thickness in the range of 0.2-2 nm may be provided between light-emitting layer 3 and layer 4.

A hole-transporting polymer may comprise arylamine repeat units, in particular repeat units of formula (V). This polymer may be a homopolymer or it may be a copolymer comprising arylene co-repeat units, for example repeat units of formula (I).

Charge transporting units may be provided in a polymer main-chain or polymer side-chain.

Encapsulation

OLEDs tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850. The substrate may be opaque in the case of an OLED with a transparent cathode.

The device is preferably encapsulated with an encapsulant (not shown) to preventingress of moisture and oxygen. Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Solution Processing

A layer containing the polymer may be formed by depositing a solution of the polymer in one or more solvents followed by evaporation of the solvent.

Solution deposition methods include coating techniques, such as spin-coating, dip-coating and blade coating and printing techniques such as inkjet printing, screen printing and roll printing.

Coating methods such as spin-coating are particularly suitable for devices wherein patterning of the electroluminescent material is unnecessary—for example for lighting applications or simple monochrome segmented displays.

Printing techniques, for example inkjet printing, are particularly suitable for high information content displays, in particular full colour displays. A device may be inkjet printed by providing a patterned layer over a first electrode, typically the anode, and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

If multiple layers of an OLED are formed by solution processing then techniques to prevent intermixing of adjacent layers include crosslinking of one layer before deposition of a subsequent layer and/or selection of materials for adjacent layers such that the material from which the first of these layers is formed is not soluble in the solvent used to deposit the second layer. For example, a hole-transporting layer formed by depositing a hole-transporting material from a solution in a solvent may be crosslinked prior to solution deposition of a light-emitting material to form a light-emitting layer. Crosslinking may be thermal or photo-crosslinking.

The polymer of the invention may be substituted with a crosslinkable group. This substituent may be bound to the repeat unit of formula (I) and/or to a co-repeat unit, if present. Suitable crosslinkable groups include groups comprising a reactive carbon-carbon double bond such as vinyl and acrylate groups, in particular double bond groups including a $CH_2$ group, and groups comprising an optionally substituted benzocyclobutane.

EXAMPLES

Monomer Example 1

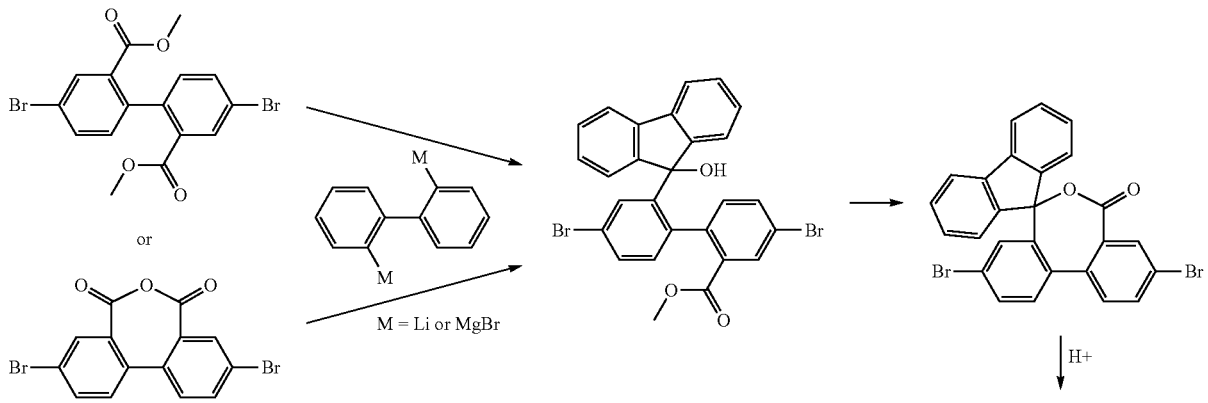

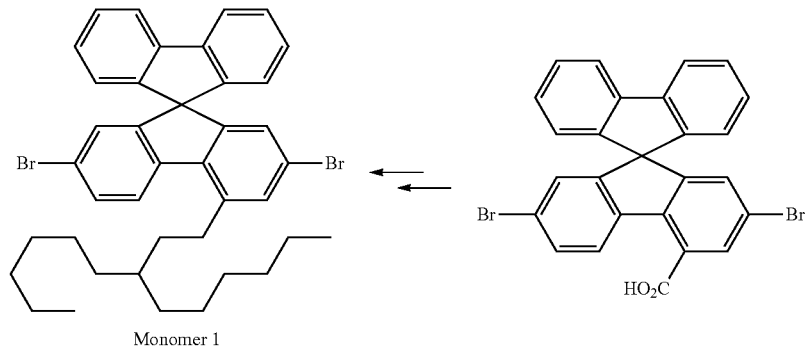

Monomer 1

Monomer Example 2

Monomer 2 was prepared according to the following method:

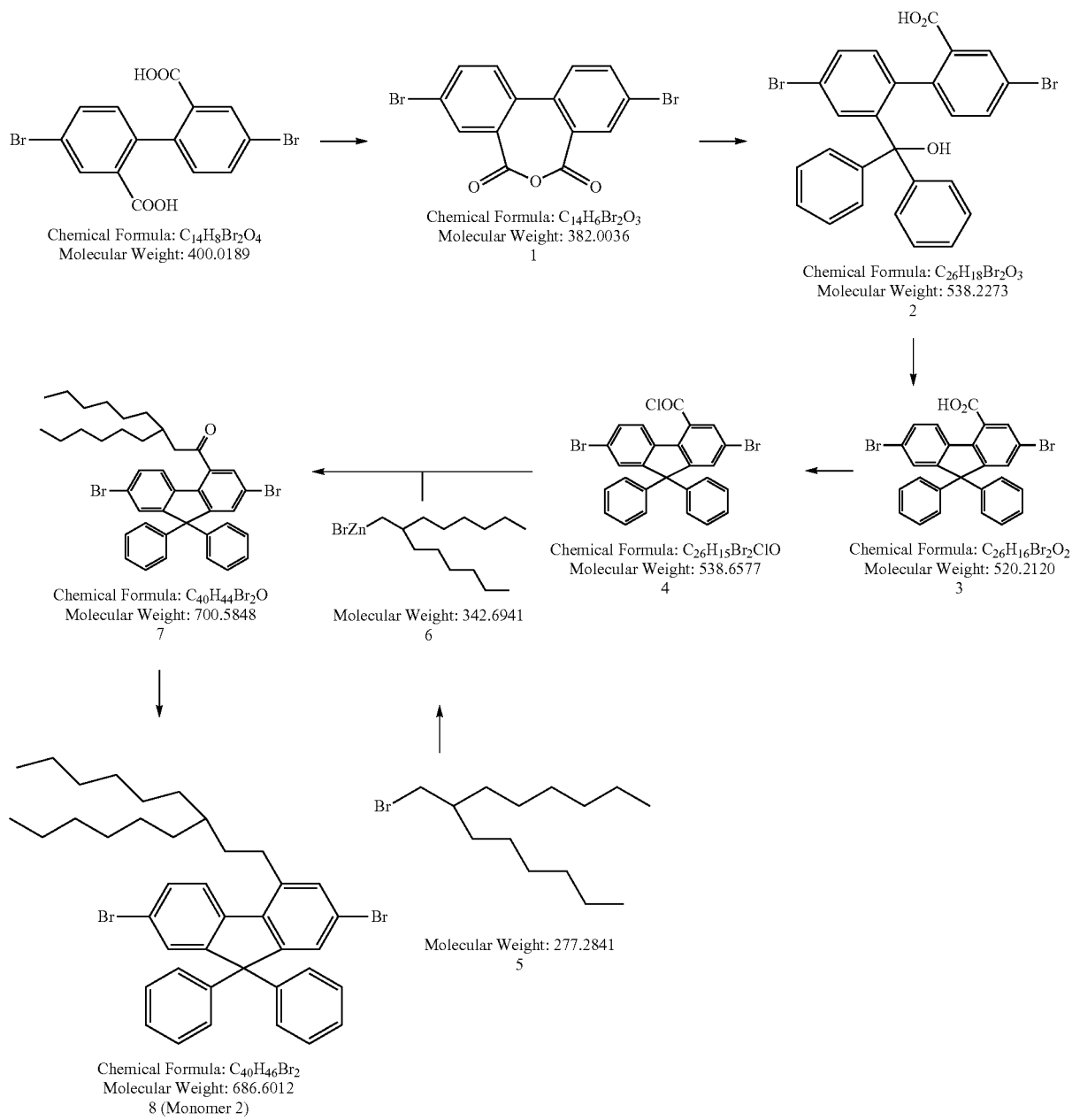

Compound 1:

Acetic anhydride (408.36 g, 4 mol) was added to 4,4'-Dibromodiphenic acid (400 g, 1 mol). The resulting slurry was stirred and heated under reflux overnight and then cooled to 60° C. Acetic acid (600 ml) was added and the stirred mixture was heated under reflux for 1 h and then cooled to room temperature. The resulting brown solid was filtered off, washed with acetonitrile and dried in a vacuum oven (50° C., ca. 2 days) to yield compound 1 (368.42 g, 96%) as a brown solid.

Compound 2:

Phenyl lithium (346.1 ml, 1.8 M in di-n-butyl ether, 0.623 mol) was added dropwise to a stirred, cooled (−78° C.) solution of compound 1 (119 g, 0.312 mol) in anhydrous THF (1.5 L) under dry nitrogen. The reaction mixture was stirred for ca. 2 h and then warmed to room temperature, stirring overnight. The reaction mixture was then cooled in an ice/water bath and water (200 ml) was added dropwise and the mixture was concentrated under vacuum to yield a dark brown waxy solid. The solid was dissolved in diethyl ether and washed twice with water, the aqueous components were extracted with diethyl ether, the combined organic extracts were dried over anhydrous $MgSO_4$ and the solvent was removed under vacuum to yield a brown oil. The oil was stirred in hydrochloric acid (2M aqueous solution) which afforded a brown precipitate which was filtered and triturated (hexane). This process yielded a brown solid, which was used in the next stage without further purification.

Compound 3:

Chlorobenzene (750 ml) was added to compound 2 (160 g, 0.297 mol) to give a light brown slurry. Trifluoroacetic acid (750 ml) was added to the stirred mixture (giving an immediate colour change from light brown to black) and all remaining material dissolved. The stirred mixture was heated under reflux for 2 days then cooled to room temperature. Water (300 ml) was added to quench the reaction. The product was extracted into ethyl acetate (5×500 ml), washed with water and the aqueous extracts were extracted with a further portion of ethyl acetate. The combined organic extracts were dried over anhydrous MgSO₄ and the solvent was removed under vacuum to yield compound 3 as a solid (139.06 g, 90%).

Compound 4:

Compound 3 (139 g, 0.267 mol) was dissolved in dry toluene (1 L) under an atmosphere of dry nitrogen with vigorous stirring. Thionyl chloride (33.6 ml, 0.452 mol) was added and the stirred mixture was heated under reflux for 24 h, with evolution of hydrogen chloride. The mixture was cooled to room temperature and the toluene and excess thionyl chloride was removed by vacuum distillation to yield a brown solid, which was used without further purification.

Compound 6:

Zinc granules (32.93 g, 0.504 mol) and lithium chloride (21.35 g, 0.504 mol) were heated to 165° C. under vacuum with vigorous stirring for 90 mins and then an atmosphere of dry nitrogen was introduced. Iodine (4.26 g, 16.8 mmol) and dry THF (500 ml) were then added to the stirred mixture, which immediately formed a brown solution that decolourised over 10 mins. The mixture was heated under reflux and 7-bromomethyltridecane (5, 93 g, 0.336 mol) was added in a single portion. Heating was continued for ca. 65 h, GCMS revealed a complete reaction had occurred. The material was used in subsequent stages without purification.

Compound 7:

Copper cyanide (33.1 g, 0.370 mol) and lithium chloride (31.3 g, 0.738 mol) were heated to 165° C. under vacuum with vigorous mixing for 5 h. The stirred mixture was cooled to room temperature, dry THF (500 ml) was added and the mixture cooled (ice/salt bath) for 15 mins. Compound 6 (0.336 mol, assumed) was added by cannula and the mixture was stirred for 15 mins. Compound 4 (0.267 mol, assumed) was added to the mixture rapidly by cannula and the stirred mixture was allowed to warm to room temperature overnight. Sodium hydroxide (aq. 10% w/v, ca. 500 ml) was added to the mixture which was stirred together for 5 mins, before the THF was removed under vacuum. The product was extracted into hexane (ca. 1 L) and the mixture separated. The organic phase was stirred over bleach for 1 h, the organic phase was separated, dried over anhydrous MgSO₄ and the solvent removed under vacuum. The resulting solid was passed through a plug of silica (hexane, with increasing volume fractions of DCM to elute) to yield an orange oil (87 g, 46%). LCMS revealed the presence of analogous methyl ester (ca. 19%) and esters of compound 5 (ca. 5%), which could not be easily separated. The mixture was carried forward without further purification.

Compound 8:

Trifluoroacetic acid (350 ml, 3.78 mol) was added to compound 7 (85 g, 0.121 mol) and the mixture was stirred. Triethylsilane (100 ml, 2.4 mol) was added to the mixture which was stirred together overnight. TLC revealed an incomplete reaction, so additional triethylsilane (40 ml) was added, the mixture was heated to 60° C. and the reaction continued for a further 2 h. The temperature was increased to 70° C. and the reaction continued overnight. The resulting precipitate was filtered and washed with water and acetonitrile. The solid was then passed though a plug of silica (10% DCM/hexane) and then recrystallised from hexane/acetonitrile. The resulting solid was recrystallised twice from ethyl acetate/IPA, toluene/methanol and toluene/acetonitrile and then dissolved in DCM and precipitated from methanol to yield compound 8 as a colourless solid (29.69 g, 36%, 99.7% purity by HPLC).

Polymer Example 1

A polymer was prepared by Suzuki polymerisation as described in WO 00/53656 of the following monomers:

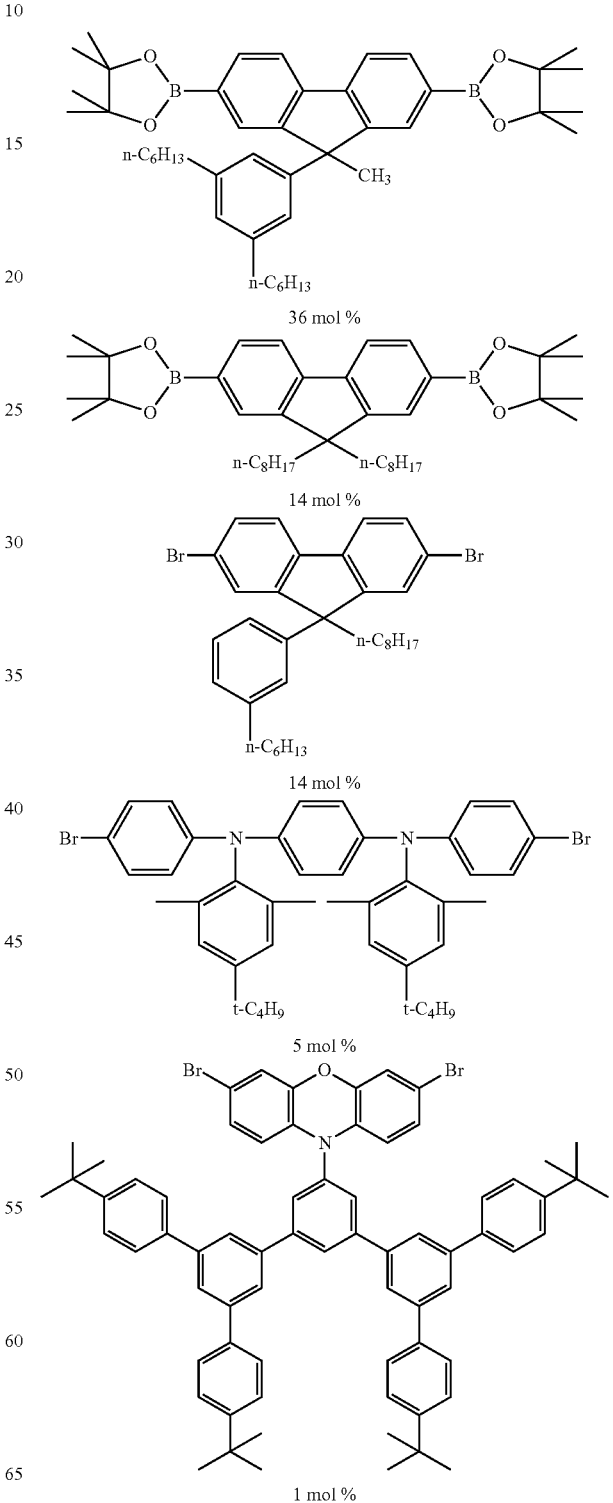

-continued

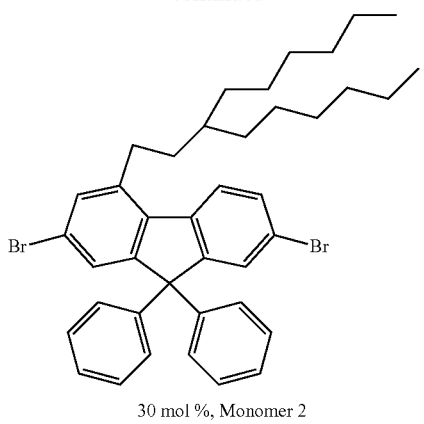 [SMILES: CCCCCCC(CCCCCC)CCc1cc(Br)cc2c1-c1ccc(Br)cc1C2(c1ccccc1)c1ccccc1]

30 mol %, Monomer 2

The glass transition temperature onset for Polymer Example 1 was 116° C.

Comparative Polymer 1

For the purpose of comparison, a polymer was prepared as described for Polymer Example 1 except that Monomer 2 was replaced with unsubstituted 2-7-dibromo-9,9-diphenyl-fluorene to form Comparative Polymer 1:

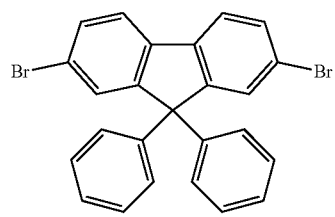 [SMILES: Brc1ccc2c(c1)C(c1ccccc1)(c1ccccc1)c1cc(Br)ccc1-2]

The glass transition temperature onset for Comparative Polymer 1 was 155° C.

Polymer Example 2

A polymer was prepared by Suzuki polymerisation as described in WO 00/53656 of the following monomers:

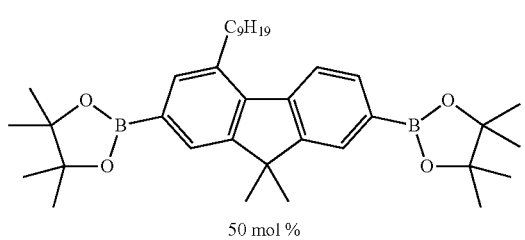

50 mol %

-continued

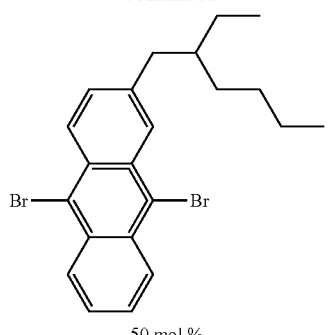

50 mol %

Device Example 1

An OLED having the following structure was prepared:

ITO/HIL/HTL/EL/Cathode

Wherein ITO is indium tin oxide; HIL is a 365 nm thick hole injection layer available from Plextronics, Inc., HTL is a 22 nm thick hole transporting layer formed by deposition and cross-linking of a hole-transporting polymer formed by Suzuki polymerisation of the monomers described below; EL is a 70 nm thick electroluminescent layer formed from a blend of 90 mol % of Polymer Example 1 and 10 mol % of an additive polymer, Additive Polymer 1 formed by Suzuki polymerisation of the monomers illustrated below; and Cathode is a cathode formed from a 2 nm layer of a metal fluoride, a 100 nm layer of aluminium and a 100 nm layer of silver.

The hole-injection layer, hole transporting layer and electroluminescent layer were each deposited by spin-coating. Following spin-coating of the hole transporting layer, this layer was heated at 180° C. for 1 hour in order to crosslink the crosslinkable groups of the hole transporting polymer.

The electroluminescent layer was heated at 160° C. for 10 minutes following its deposition.

The monomers used to form the additive polymer and hole-transporting polymer are set out below. Each of these polymers were formed by Suzuki polymerisation as described in WO 00/53656.

Additive Polymer 1

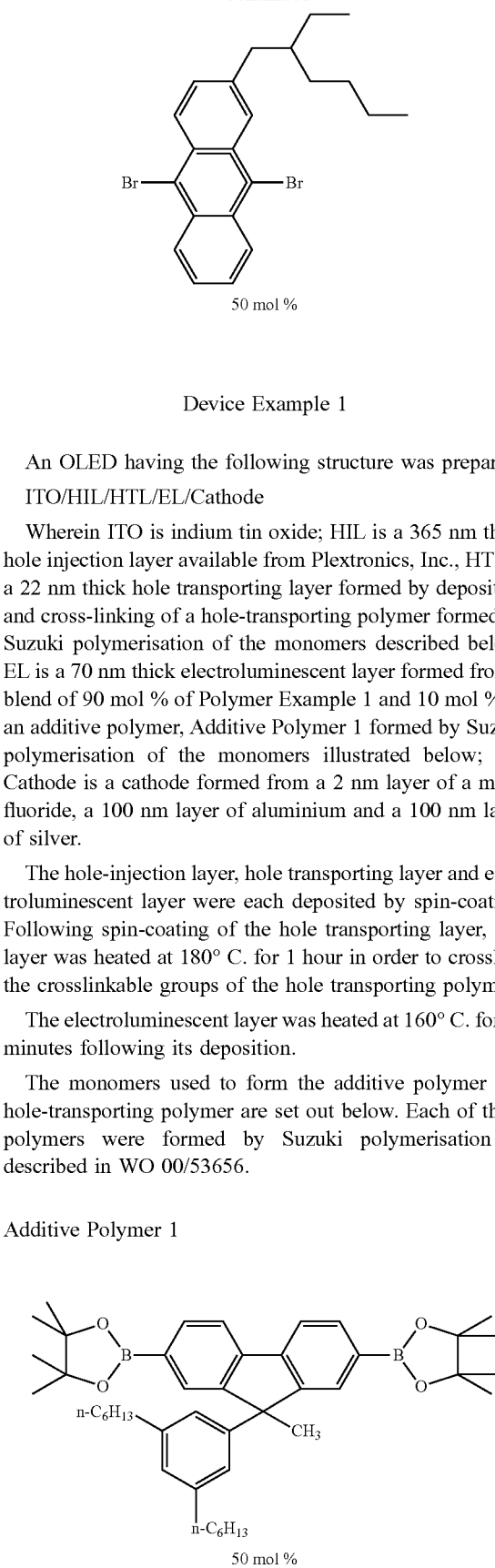

50 mol %

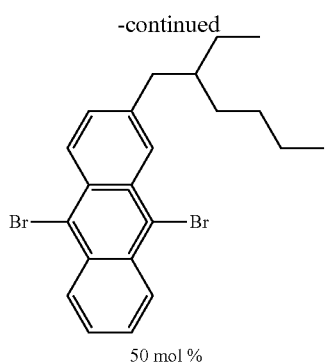

50 mol %

The additive polymer accepts triplet excitons from the light-emitting polymer to allow for triplet-triplet annihilation, which may contribute to the fluorescent emission of the device.

Hole-Transporting Polymer

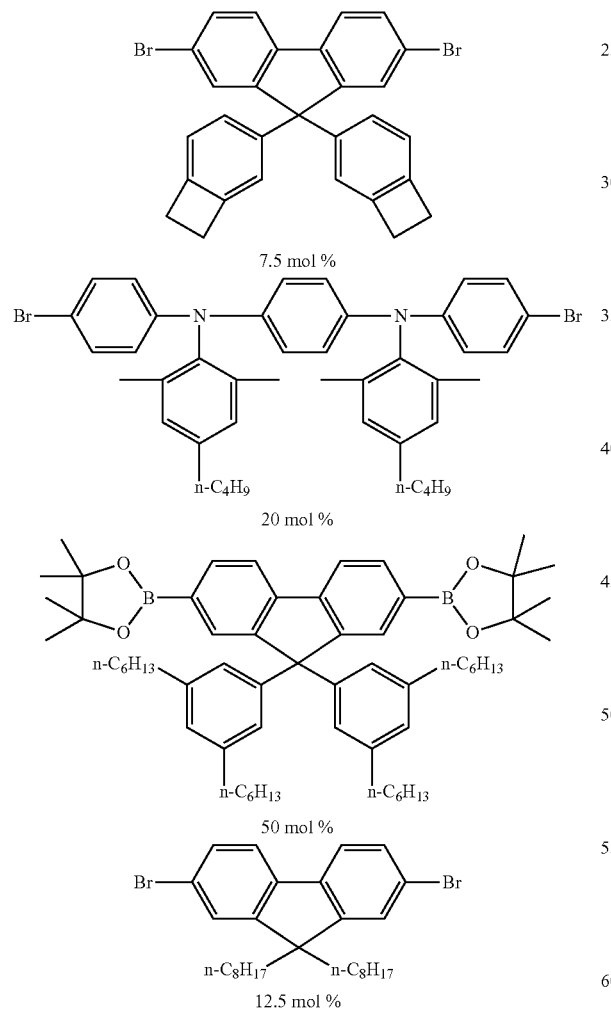

Comparative Device 1

An OLED was prepared according to Device Example 1, except that Comparative Polymer 1 was used in place of Polymer Example 1.

Figure 2:
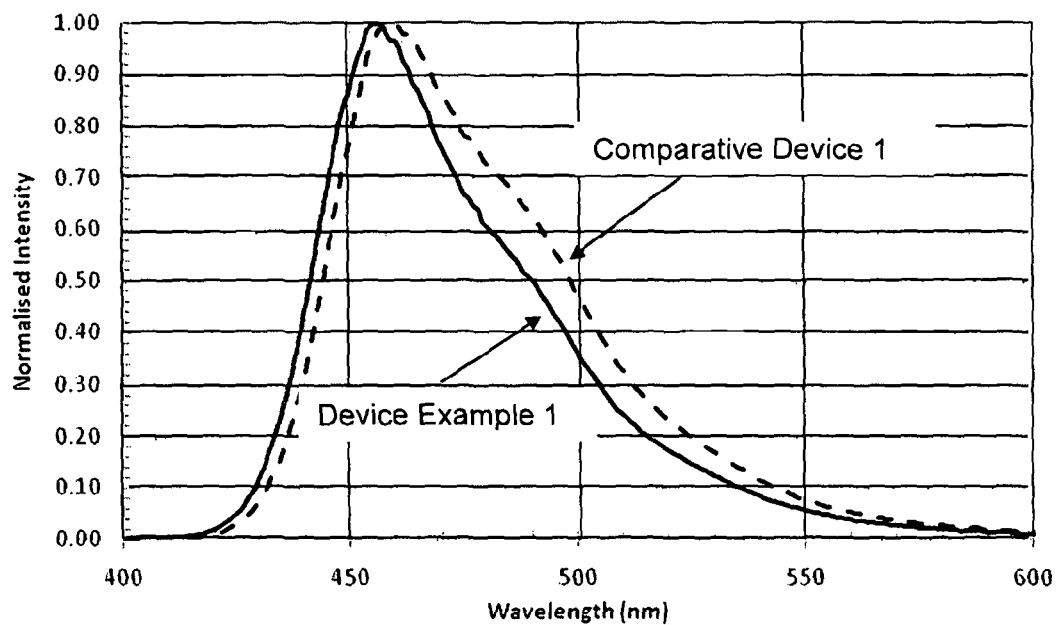
FIG. 2 is the electroluminescent spectra of a device according to an embodiment of the invention and a comparative device.
Figure 3:
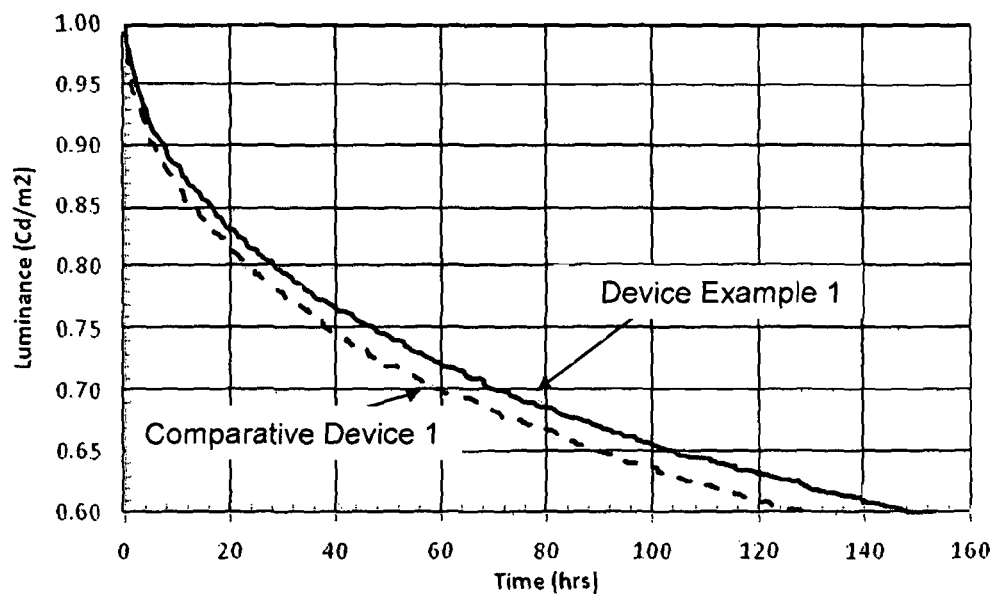
FIG. 3 is a graph of luminance vs. time for an organic light-emitting device comprising a light-emitting polymer according to an embodiment of the invention and for a comparative device.

With reference to FIG. 2, the electroluminescent spectra of Device Example 1 (solid line) and Comparative Device 1 (dotted line) is shifted to a slightly shorter peak wavelength. With reference to FIG. 3, the $T_{60}$ of Device Example 1 (that is, the time taken for luminance of the device to fall to 60% of its original value at constant current) is significantly longer. Without wishing to be bound by any theory, it is believed that this improvement in lifetime may be due to improved film morphology in the film of the polymer containing Polymer Example 1 as compared to the Film containing Comparative Polymer 1.

Device Example 2

A device was prepared according to Device Example 1 except that the electroluminescent layer was formed from a mixture of a light-emitting polymer described below and Polymer Example 2 as an additive polymer in a 90:10 molar ratio.

The light-emitting polymer of Device Example 2 was formed by Suzuki polymerisation as described in WO 00/53656 of the following monomers:

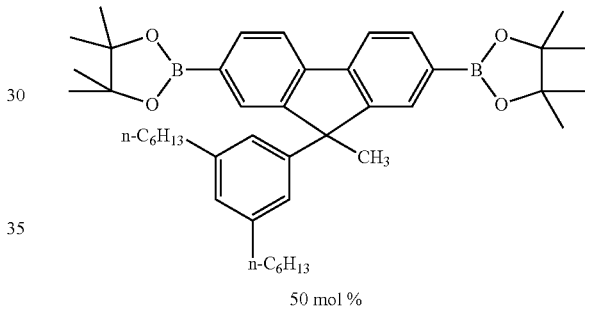

50 mol %

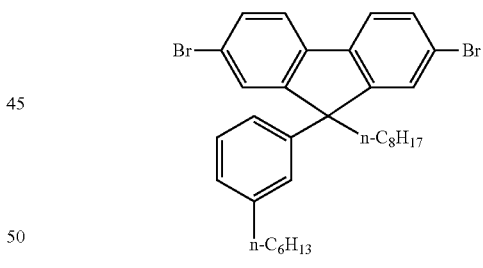

44 mol %

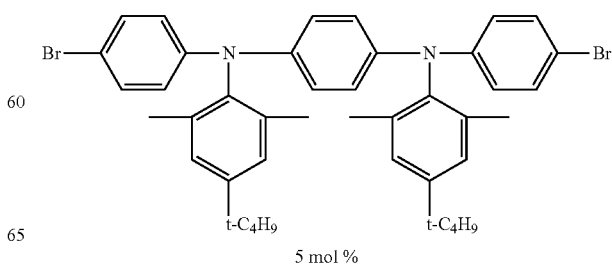

5 mol %

-continued

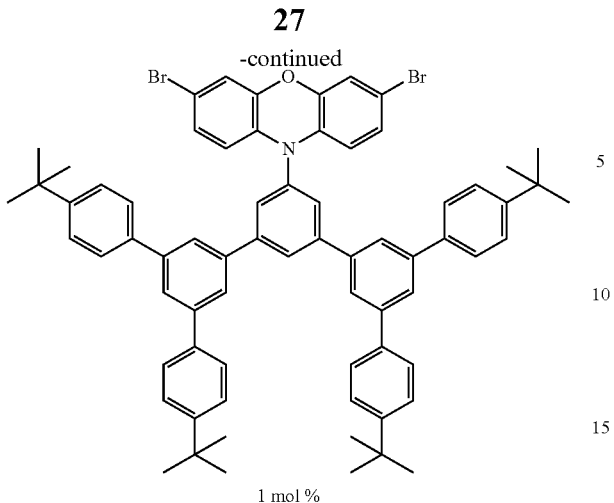

1 mol %

Comparative Device 2

A device was prepared according to Device Example 2 except that Polymer Example 2 was replaced with Additive Polymer 1 described above.

Figure 4:
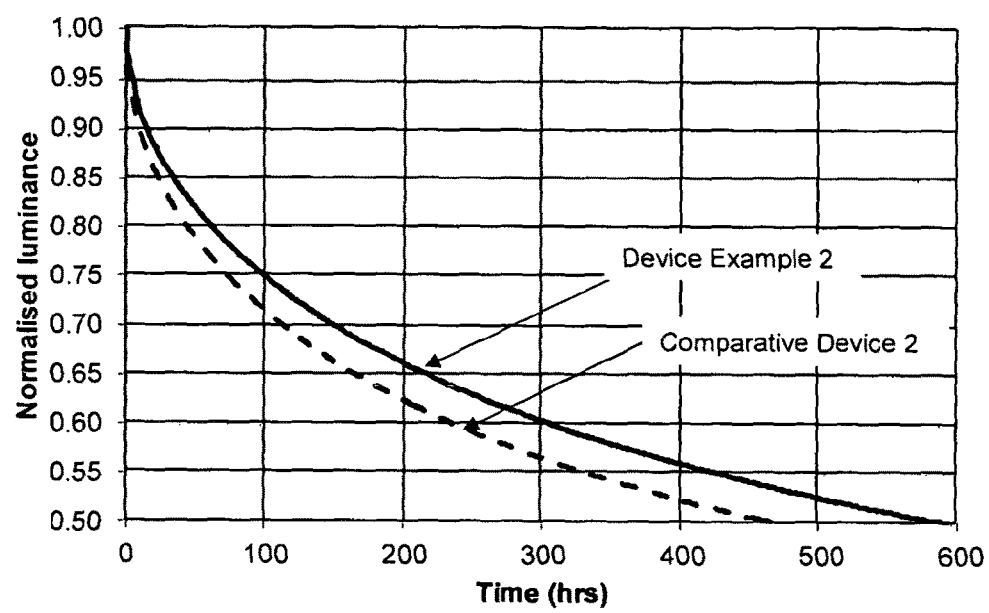
FIG. 4 is a graph of luminance vs. time for an organic light-emitting device having a light-emitting layer a triplet-accepting polymer according to an embodiment of the invention and for a comparative device.

With reference to FIG. 4 it can be seen that Device Example 2, containing Polymer Example 2 as an additive polymer, has a higher lifetime than Comparative Device 2.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A polymer comprising a substituted or unsubstituted repeat unit of formula (I):

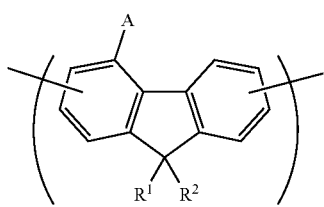

(I)

wherein $R^1$ and $R^2$ in each occurrence are independently selected from H or a substituent; $R^1$ and $R^2$ may be linked to form a ring; and A is a substituted or unsubstituted linear, branched or cyclic alkyl group.

2. The polymer according to claim 1 wherein $R^1$ and $R^2$ are independently selected from the group consisting of hydrogen; substituted or unsubstituted aryl or heteroaryl groups; a linear or branched chain of substituted or unsubstituted aryl or heteroaryl groups; and substituted or unsubstituted alkyl wherein one or more non-adjacent C atoms of the alkyl group may be replaced with O, S, substituted N, C=O and —COO—.

3. The polymer according to claim 1 wherein $R^1$ and $R^2$ are not linked.

4. The polymer according to claim 1 wherein $R^1$ and $R^2$ are linked to form a repeat unit of formula (II):

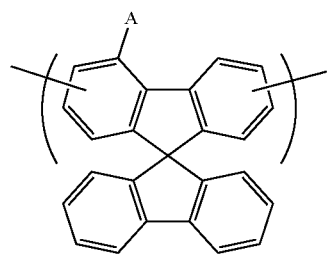

(II)

5. The polymer according to claim 1 wherein the repeat unit of formula (I) has formula (III):

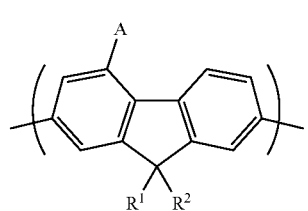

(III)

6. The polymer according to claim 1 wherein the polymer comprises repeat units of formula (I) and one or more further repeat units comprising substituted or unsubstituted fluorene repeat units other than repeat units of formula (I).

7. The polymer according to claim 6 wherein the polymer comprises substituted or unsubstituted repeat units of formula (IV):

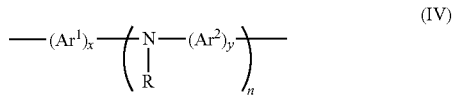

(IV)

wherein $Ar^1$ and $Ar^2$ in each occurrence are independently selected from substituted or unsubstituted aryl or heteroaryl groups, n is greater than or equal to 1, R is H or a substituent, x and y are each independently 1, 2 or 3, and any of $Ar^1$, $Ar^2$ and R may be linked by a direct bond or a divalent linking group.

8. The polymer according to claim 1 wherein A is a branched alkyl.

9. A substituted or unsubstituted monomer of formula (V):

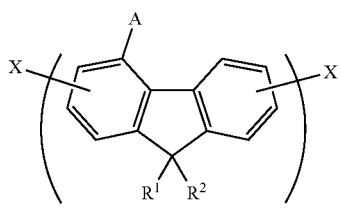

(V)

wherein X is a polymerisable group, and wherein $R^1$ and $R^2$ in each occurrence are independently selected from H or a substituent; $R^1$ and $R^2$ may be linked to form a ring; $R^1$ and $R^2$ are not linked; $R^1$ and $R^2$ are independently selected from the group consisting of hydrogen, substituted or unsubstituted aryl or heteroaryl groups a linear or branched chain of substituted or unsubstituted aryl or heteroaryl groups, and substituted or unsubstituted alkyl wherein one or more non-adjacent C atoms of the alkyl group may be replaced with O, S, substituted N, C=O and —COO—; or $R^1$ and $R^2$ are linked to form a repeat unit of formula (II):

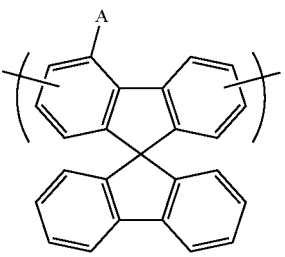

(II)

10. The monomer according to claim 9 wherein X is a leaving group capable of participating in a metal-mediated cross-coupling reaction.

11. The monomer according to claim 10 wherein X is selected from the group consisting of chlorine, bromine, iodine, sulfonic acid or ester, and boronic acid or ester.

12. A method of forming a polymer according to claim 1 comprising the step of polymerizing a substituted or unsubstituted monomer of formula (V):

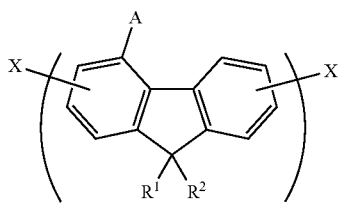

(V)

wherein X is a polymerisable group, and wherein $R^1$ and $R^2$ in each occurrence are independently selected from H or a substituent; $R^1$ and $R^2$ may be linked to form a ring; $R^1$ and $R^2$ are not linked; $R^1$ and $R^2$ are independently selected from the group consisting of hydrogen, substituted or unsubstituted aryl or heteroaryl groups a linear or branched chain of substituted or unsubstituted aryl or heteroaryl groups, and substituted or unsubstituted alkyl wherein one or more non-adjacent C atoms of the alkyl group may be replaced with O, S, substituted N, C=O and —COO—; or $R^1$ and $R^2$ are linked to form a repeat unit of formula (II):

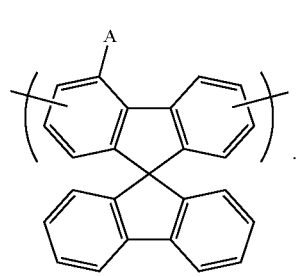

(II)

13. The method according to claim 12 wherein the polymerization is performed in the presence of a nickel catalyst or in the presence of a palladium catalyst and a base.

14. An organic electronic device comprising at least one layer comprising a polymer according to claim 1.

15. The organic electronic device according to claim 14 wherein the device is an organic light-emitting device comprising an anode, a cathode and a light-emitting layer between the anode and the cathode.

16. The organic electronic device according to claim 15 wherein the at least one layer comprising a polymer is the light-emitting layer or is a hole transporting layer between the anode and the light-emitting layer.

17. The organic electronic device according to claim 16 wherein the polymer is a light-emitting polymer of the light-emitting layer.

18. The organic electronic device according to claim 16 wherein the light-emitting layer comprises one or more light-emitting materials and a polymer, wherein the polymer is a triplet-accepting polymer.

19. A method of forming an organic electronic device according to claim 14 comprising the step of depositing the at least one layer comprising a polymer.

20. The method according to claim 19 wherein the at least one layer is formed by depositing a solution comprising the polymer and at least one solvent, and evaporating the solvent.

* * * * *